United States Patent
Weimer et al.

(10) Patent No.: US 8,637,156 B2
(45) Date of Patent: Jan. 28, 2014

(54) METHODS FOR PRODUCING COATED PHOSPHORS AND HOST MATERIAL PARTICLES USING ATOMIC LAYER DEPOSITION METHODS

(76) Inventors: Alan W. Weimer, Niwot, CO (US); Steven M. George, Boulder, CO (US); Karen J. Buochler, Westminster, CO (US); Joseph A. Spencer, II, Longmont, CO (US); Jarod McCormick, Boulder, CO (US)

( * ) Notice: Subject to any disclaimer, the term of this patent is extended or adjusted under 35 U.S.C. 154(b) by 0 days.

(21) Appl. No.: 13/453,157

(22) Filed: Apr. 23, 2012

(65) Prior Publication Data
US 2012/0199793 A1    Aug. 9, 2012

Related U.S. Application Data

(63) Continuation of application No. 12/708,562, filed on Feb. 19, 2010, now Pat. No. 8,163,336, which is a continuation of application No. 11/473,289, filed on Jun. 22, 2006, now abandoned.

(60) Provisional application No. 60/693,398, filed on Jun. 23, 2005.

(51) Int. Cl.
*B32B 5/16*    (2006.01)

(52) U.S. Cl.
USPC ........... 428/402; 428/403; 428/404; 427/128; 427/212; 427/214; 427/215; 427/255; 427/249.1; 427/249.5; 427/561

(58) Field of Classification Search
USPC .......... 428/402, 403, 404; 427/128, 212, 214, 427/215, 249.5, 561, 249.1, 255
See application file for complete search history.

(56) References Cited

U.S. PATENT DOCUMENTS

| 5,507,976 | A | * | 4/1996 | Bringley et al. | ....... 252/301.4 H |
| 5,811,924 | A | * | 9/1998 | Okumura et al. | ............. 313/487 |
| 6,248,261 | B1 | * | 6/2001 | Takemura et al. | ...... 252/301.6 S |
| 6,613,383 | B1 | * | 9/2003 | George et al. | ................. 427/212 |
| 6,713,177 | B2 | * | 3/2004 | George et al. | ................. 428/402 |
| 6,913,827 | B2 | * | 7/2005 | George et al. | ................. 428/402 |

FOREIGN PATENT DOCUMENTS

| WO | 2003-0013705 A | 12/2005 |
| WO | WO2005113705 | * 12/2005 |

* cited by examiner

*Primary Examiner* — Leszek Kiliman
(74) *Attorney, Agent, or Firm* — Gary C Cohn PLLC

(57) ABSTRACT

Layers of a passivating material and/or containing luminescent centers are deposited on phosphor particles or particles that contain a host material that is capable of capturing an excitation energy and transferring it to a luminescent center or layer. The layers are formed in an ALD process. The ALD process permits the formation of very thin layers. Coated phosphors have good resistance to ambient moisture and oxygen, and/or can be designed to emit a distribution of desired light wavelengths.

9 Claims, No Drawings

METHODS FOR PRODUCING COATED PHOSPHORS AND HOST MATERIAL PARTICLES USING ATOMIC LAYER DEPOSITION METHODS

CROSS-REFERENCE TO RELATED APPLICATIONS

This application is a continuation of application Ser. No. 12/708,562 filed 19 Feb. 2010, now U.S. Pat. No. 8,163,336, which was a continuation of application Ser. No. 11/473,289 filed 22 Jun. 2006, now abandoned, and claims benefit of United States Provisional Application No. 60/693,398, filed 23 Jun. 2005.

BACKGROUND OF THE INVENTION

This invention relates to phosphor particles having ultrathin coatings on their surfaces and to methods for making and using such coated particles.

Phosphors are used in flat panel plasma displays (FPDs), cathode ray tubes, x-ray imaging devices, field emission devices, fluorescent lighting fixtures, and a variety of other applications to generate visual images or simply provide light. Although a wide variety of phosphor materials are known for use in these applications, those materials all have in common the ability to generate a characteristic light in response to exposure to an excitation energy source. The excitation energy source may be, for example, a photon (photoluminescence, or PL), high energy electron beam (cathodic luminescence, or CL), an applied electrical field (electroluminescence, or EL), or applied heat (thermoluminescence). Electroluminescent phosphors are of particular interest for flat panel display applications.

Flat panel displays commonly include a phosphor layer which is sandwiched between two insulator layers. A reflecting electrode such as aluminum and a transparent electrode such as indium tin oxide bracket the phosphor/insulator sandwich. In the standard MISIM (metal-insulator-semiconductor (phosphor)-insulator-metal) construction, a glass or other transparent substrate lies atop the transparent electrode. Various filter layers may be incorporated into the structure to assist with color production.

The phosphor material is commonly printed as a thin film onto an adjacent layer. There are several reasons that make it preferable to use a powdered phosphor. Chief among these is cost—powdered phosphors can be used in very small amounts and so the amount of phosphor that is needed can be significantly reduced. In addition, light loss through internal reflection can be minimized using particles and there is no loss in brightness due to light lost at edges, as in thin phosphor films. Efficiency (light emitted/unit applied power) is also higher for powders. The use of powders also makes it possible to produce all colors in a single phosphor plane, as a particulate mixture of different color-emitting phosphors can be formed as a single layer.

The phosphor particles typically are composites of a host material that in the case of electroluminescent particles provides a necessary set of electrical properties, and one or more "luminescent centers". The "luminescent centers" are usually metal cations and sometimes anions which are "doped" or otherwise combined with the host material. These ions usually become incorporated into the crystalline lattice of the host material, or dispersed as discrete domains within the host material. The luminescent centers provide the desired optical emission properties to the phosphor particles. Again, a wide variety of these materials are known, which differ in their composition according to the specific application and desired emitted color. Phosphors that emit white, yellow, red, green and blue wavelengths of visible light are commonly used in display and monitor applications.

It is often necessary to coat the surface of the phosphor particles. Reasons for doing this include (1) particle protection, often against reaction with water, but also against reaction with air, other oxidants, or contaminants; (2) improving screening characteristics and (3) improving contrast or pigmentation. Among the coating materials used for these purposes are ZnO, MgO, $In_2O_3$, $Al_2O_3$ and $SiO_2$, and CuS. Chemical vapor deposition (CVD) and sol-gel methods have been used to provide coatings of these types.

To be effective, the applied coating needs to be as uniform and as thin as possible. It is also beneficial that the coating process does not cause individual particles to agglomerate to form larger aggregates. In addition to having much larger diameters than are wanted, these aggregates often tend to break apart, revealing defects in the coating at the break areas. The underlying particles are subject to attack from water, oxidants and other materials at the places where these defects occur. Neither CVD nor sol-gel techniques are entirely satisfactory, as agglomerates tend to form readily in these processes. In addition, these methods require relatively large amounts of raw materials, as only a portion of the applied reactants actually become applied to the surface of the phosphor particles. Quite often, material applied by these processes form separate particles instead of forming films on the surface of the phosphor particles. For various reasons, it is desired to develop phosphor particles that are smaller than those commonly used now. Commercially available phosphor particles usually have diameters in the 1-50 micron range. Phosphor particles having diameters of less than 1 micron, and in particular less than 100 nm, potentially offer advantages in screen design and performance. CVD and sol-gel coating methods are particularly unsuitable for coating these smaller particles.

It is therefore desirable to provide a method by which thin, conformal coatings can be applied to the surface of phosphor particles. Such a method preferably will result in minimal agglomeration of the particles, and provide coatings with minimal defects. The method also desirably permits very thin coatings to be applied, and further allows for close control over coating thickness. Even more preferably, the method would allow for sequential deposition of multiple coatings of different materials onto the phosphor. For example, a preferred method would permit one to deposit a luminescent layer atop a particle of the host material, and then to deposit a protective layer atop the luminescent layer.

SUMMARY OF THE INVENTION

This invention is a method comprising forming a layer of an inorganic material on the surface of a phosphor particle via an atomic layer deposition process.

This invention is also a method comprising forming a luminescent layer on the surface of a particle of a host material, wherein the luminescent layer is formed via an atomic layer deposition process.

This invention is also a phosphor particle having a passivating film of 5-100 nm thickness which has been deposited by an ALD process.

This invention is also a base particle having a luminescent layer of 5-100 nm thickness. The base particle is in preferred embodiments a host material, which is capable of capturing an excitation energy and transferring it to a luminescent center in the luminescent layer.

The process of the invention permits the deposition of an extremely thin layer onto the surface of the phosphor particle or host material particle. In some embodiments, the applied layer can act as a passivating layer, protecting the base particle against corrosion or attack from ambient agents such as water or air. The ALD process permits effective protective layers to be formed even at thicknesses of less than 100 nm. The resulting phosphor particles often perform better, in that they often emit more light (per unit applied energy) than phosphors coated using CVD or sol-gel processes. This increases the energy demands of a display made using the phosphor.

By applying a luminescent layer (as described more fully below) over a base particle (or an inert material), it is possible to use lower cost materials as the base particle, and thus reduce phosphor cost.

This invention also provides the ability to prepare a wide variety of specialized phosphor particles. In one aspect of the invention, at least one applied layer is of a material that can capture all or a part of the light emitted by an underlying phosphor particle, and re-emit that light at a different (typically lower energy) wavelength. It is also possible to use the applied coatings to produce particles that produce multiple wavelengths of emitted light.

DETAILED DESCRIPTION OF THE INVENTION

The atomic layer deposition process is characterized in that at least two different reactants are needed to form the coating layer. The reactants are introduced into the reaction zone individually, sequentially and in the gas phase. Excess amounts of reactant are removed from the reaction zone before introducing the next reactant. Reaction by-products are removed as well, between introductions of the reagents. This procedure ensures that reactions occur at the surface of the phosphor particles, rather than in the gas phase. Gas phase reactions, such as occur in chemical vapor deposition processes, are undesirable for several reasons. CVD reactions tend to cause particle agglomeration, form uneven and non-conformal coatings, and use greater amounts of raw materials than desired.

A purge gas is typically introduced between the alternating feeds of the reactants, in order to further help to remove excess reactants. A carrier gas, which is usually but not necessarily the same as the purge gas, generally is introduced during the time each reactant is introduced. The carrier gas may perform several functions, including (1) facilitating the removal of excess reactant and reaction by-products, (2) distributing the reactant through the reaction zone, thereby helping to expose all particle surfaces to the reactant and (3) fluidizing the phosphor particles so that all particle surfaces become exposed to the reactant.

A typical pattern of introducing reactants (in a two-reagent ALD reaction scheme) is:
 1. Introduce purge/fluidizing gas.
 2. Introduce mixture of carrier gas and first reagent.
 3. Introduce purge/fluidizing gas and/or pull a high vacuum to remove excess quantities of the first reagent as well as reaction by-products.
 4. Introduce mixture of carrier gas and second reagent.
 5. Introduce purge/fluidizing gas and/or pull a high vacuum to remove excess quantities of the second reagent and reaction by-products.
 6. Repeat steps 2-5 until desired coating thickness is obtained.

As mentioned, the same material may be used as the purge/fluidizing gas and each carrier gas. It is also possible to use different materials.

Analogous patterns are used when the film-forming reaction involves more than two reagents, or when a catalyzed reaction system is used. An example of a catalyzed reaction system is described below.

Such atomic layer controlled growth techniques permit the formation of deposits of up to about 0.3 nm in thickness per reaction cycle, and thus provide a means of extremely fine control over deposit thickness. The reactions are self-limited, and in most instances can be repeated to sequentially deposit additional layers of the deposited material until a desired thickness is achieved.

It is preferred to treat the particles before initiating the reaction sequence to remove volatile materials that may be absorbed onto the particle surface. This is readily done by exposing the particles to elevated temperatures and/or vacuum. Also, in some instances a precursor reaction may be performed to introduce desirable functional groups onto the surface of the particle.

Reaction conditions are selected mainly to meet two criteria. The first criterion is that the reagents are gaseous under the conditions of the reaction. Therefore, temperature and pressure conditions are selected such that the reactants are volatilized. The second criterion is one of reactivity. Conditions, particularly temperature, are selected such that the desired reaction between the film-forming reagents (or, at the start of the reaction, the first-introduced reagent and the particle surface) occur at a commercially reasonable rate.

The temperature of the reactions may range from 250-700° K. The temperature is preferably no greater than about 475° K and more preferably no greater than 425° K when the particle being coated is a phosphor rather than simply a particle of the host material. Temperatures in excess of these tend to cause diffusion of the luminescent centers from the crystalline lattice of the host material, which destroys or diminishes the ability of the particle to emit light.

Specific temperature and pressure conditions will depend on the particular reaction system, as it remains necessary to provide gaseous reactants. Subatmospheric pressures will normally be required.

A suitable apparatus for conducting the ALD reaction is one which permits the particles to become separated so that all particle surfaces become exposed to the reagents. One convenient method for exposing the base particles to the reagents is to form a fluidized bed of the particles, and then pass the various reagents in turn through the fluidized bed under reaction conditions. Methods of fluidizing particulate materials are well known, and generally include supporting the particles on a porous plate or screen. A fluidizing gas is passed upwardly through the plate or screen, lifting the particles somewhat and expanding the volume of the bed. With appropriate expansion, the particles behave much as a fluid. The reagents can be introduced into the bed for reaction with the surface of the particles. In this invention, the fluidizing gas also can act as an inert purge gas for removing unreacted reagents and volatile or gaseous reaction products.

In addition, the reactions can be conducted in a rotating cylindrical vessel or a rotating tube. A rotating reactor comprises a hollow tube that contains the base particles. The reactor may be held at an angle to the horizontal, so that the particles pass through the tube through gravitational action. In such a case, the reactor angle determines the flow rate of the particulate through the reactor. The reactor can be rotated in order to distribute individual particles evenly and expose all particles to the reactants. The reactor design permits the substrate particles to flow in a near plug-flow condition, and is particularly suitable for continuous operations. The rotating cylindrical vessel can also be sealed on both ends and have porous metal walls that allow the gases to flow in and out of the rotating cylindrical vessel. This rotary reactor is convenient for static reactant exposures and batch processing of phosphor particles.

The progress of the reaction can be monitored using techniques such as transmission Fourier transform infrared techniques, transmission electron spectroscopy, scanning electron microscopy, Auger electron spectroscopy, x-ray fluorescence, X-ray photoelectron spectroscopy and x-ray diffraction.

The particles used as substrates in this invention are either (1) phosphor particles, i.e. particles that include both host material and luminescent centers and emit photons in response to the application of a particular type of excitation energy, or (2) particles of a host material.

The composition of the phosphor or host material is not particularly limited. All that is necessary is that the particle contains some surface functional group which can serve as a site through which the first-applied ALD reagent can become bonded to the substrate particle. Useful functional groups are typically an M—H, M—O—H, M—S—H or M—N—H group, where M represents an atom of a metal or semi-metal. If necessary, these sites can be introduced onto the particle surface through various preparative methods.

Suitable host materials are materials that can capture one or more forms of excitation energy and transfer the captured energy to the luminescent center. Examples of phosphor host materials include, for example, ZnS, CaS, (ZnCd)S, CaS, (CaSrGa)S, $CaGa_2S_4$, $ZnGa_2O_4$, $Zn_2SiO_4$, $Y_2O_2S$, $Y_2SiO_5$, SrS, $SrGa_2S_4$, ZnO, $Y_2O_3$ and the like. Materials that are susceptible to oxidation and/or hydrolysis when exposed to air are of particular interest, as it is usually necessary to provide a passivating film on the surface of such materials.

The term "luminescent center" refers to ions contained within the crystalline lattice of the host material, which render the phosphor capable of emitting a photon in response to the excitation energy that is captured by the host material. The luminescent center typically includes a metal cation. In some cases, an anion such as a halide forms the luminescent center in conjunction with the metal cation. Luminescent centers each typically produce photons of one or more characteristic wavelengths. The selection of luminescent center is therefore dictated mainly by the color of light that is to be produced and the ability to function together with the host material. In cases where the substrate particle is the phosphor itself (rather than simply the host material), the selection of luminescent center is not considered critical to the invention, provided that the substrate particle has some functional groups as described before.

Luminescent centers that include manganese, samarium, europium, terbium, cerium, selenium, silver and like atoms are of particular interest in forming electroluminescent materials for flat screen displays. In some instances, combinations of different metals may constitute the luminescent center. For instance a zinc sulfide host material containing both europium and cerium as luminescent centers forms a phosphor that emits white light, rather than the red (europium) and blue-green (cerium) colors emitted by the individual metals alone.

In most cases, the luminescent center is incorporated into the crystalline lattice of the host material. However, it is also possible that the luminescent center forms domains within or upon the host material. It is not considered critical to the invention that the luminescent center have any particular structural or spatial relationship to the host material, provided that the phosphor particle as a whole performs the desired function.

A combination of host material and luminescent center is often described using the notation XX:YY, where XX designates the host material and YY designates the luminescent center. Some particular phosphor materials of interest for use in this invention include ZnS:Mn (which produces yellow light), ZnS:Sm,Cl (red), CaS:Eu (red), CaSSe:Eu (red), ZnS:TbOF (green), ZnS:Tb (green), CaS:Ce,Cl, (green), $ZnGa_2O_4$:Mn (green), $ZnSiO_4$:Mn (green), SrS:Ce,F (blue-green), SrS:Ce,Mn,Cl (blue-green), SrS;Ce (blue-green), ZnS:Tm,F (blue), $SrGa_2S_4$:Ce (blue), $CaGa_2S_4$:Ce (blue), SrS:Ce,Eu (white) and ZnS:Mn/SrS:Ce (white).

The host material or phosphor is in the form of a particulate. The size of the particles may range to up about 500 µm, with preferred particle sizes ranging from the nanometer range (e.g. about 0.001 µm) to about 100 µm, more preferred particle sizes ranging from 0.005 to about 50 µm, even more preferred particle sizes ranging from about 0.05 to 35 µm and most preferred particle sizes ranging from about 0.4 to about 25 µm. The invention is particularly suitable for coating extremely fine phosphor particles having a particle size of 1 micron or less, especially less than 100 nm. Particle size can also be expressed in terms of the surface area of the particles. Preferred particulate materials have surface areas in the range from about 0.1 to about 200 $m^2$/g or more.

The ALD coating may be any coating that can be applied via an ALD process. Preferred ALD coatings are those which can be applied via an ALD process at a temperature no higher than 475°K, and especially 425°K or less. Several types of coatings are of particular interest. The first type is a passivating film that protects the underlying particle from undesired reactions, such as with air, ambient humidity, or other materials. The second type is a film that constitutes or contains a luminescent layer. By "luminescent layer", it is meant a layer that contains luminescent centers which emit photons in response to excitation energy captured by the host material (or other components of the luminescent layer). The luminescent layer may and preferably does comprise a host material as described above, which contains the luminescent centers.

Suitable films of the first type include metal or semi-metal oxides, sulfides, phosphides and nitrides, in which the metal ion does not function as a luminescent center. The film is preferably transparent or nearly transparent to the photons emitted by the underlying phosphor particle, and forms a barrier to air, moisture and/or other ambient materials from which the underlying particle is to be protected. Films of particular interest include oxides such as silicon dioxide, zirconia, alumina, silica, yttria, zinc oxide, magnesium oxide, $TiO_2$ and the like; nitrides such as silicon nitride, AlN and BN; and sulfides such as gallium sulfide, tungsten sulfide and molybdenum sulfide.

Suitable films of the second type (luminescent layers) include ions that function as luminescent centers. These ions are typically present in small quantities, the remainder of the luminescent layer being a non-luminescent inorganic material that is either a host material (i.e., one that captures an excitation energy and transfers the captured energy to the luminescent center), or some other material that permits excitation energy to be transferred from the underlying host material to the luminescent center in the luminescent layer. Metal cations or anions that function as luminescent centers, and which can be used as such in the luminescent layer, are as described above. All that is necessary is that they are capable of being deposited via an ALD process.

A luminescent layer can be formed in at least two ways. In one method, a non-luminescent material is applied onto the particle surface via repeated half-reactions, and the luminescent center is formed by occasionally substituting into the ALD reaction sequence a precursor that contains the luminescent metal. This method forms extremely thin layers containing the luminescent centers within a thicker luminescent layer. Thus, for example, a ZnS layer may be deposited by alternately exposing a host material particle with zinc-containing precursor and a reducing agent (typically hydrogen sulfide) in a reaction sequence as described before. Occasionally, one or more of the exposures substitutes a precursor that contains the luminescent center metal for the zinc-containing precursor. This introduces the luminescent center metal into the deposited coating. Generally it is only necessary to provide the luminescent center metal in amounts up to 100 ppm or less of the weight of the luminescent layer.

In the second method, a precursor that contains the luminescent center is mixed with one of the precursors for the non-luminescent material. In this case, both precursors should be able to react with the same co-reactant in the ALD process. For example, a precursor containing the luminescent center metal may be introduced simultaneously with a zinc-containing precursor. Each is then reduced simultaneously with a single reducing agent (for example, hydrogen sulfide) to form a layer containing both the zinc and the luminescent center metal.

When a luminescent layer is applied, a film of the first type may be applied over it to provide a passivating coating.

A third type of film is a material that captures energy captured and transformed by the underlying particle (such as light emitted by a phosphor particle that serves as the base particle), and emits light at some specialized wavelength. In this embodiment, the base particle may be a host material (which captures and transfers the energy to the applied film) or a phosphor (which will capture energy and emit light, which is then capture by the applied film and re-emitted at a different (usually lower energy) wavelength). This method permits the development of phosphor particles that emit specialized wavelengths of light or specialized combinations of wavelengths of light.

The second and third types of film may contain multiple types of luminescent centers, i.e., different cations or anions that each can act as a luminescent center to produce its own characteristic wavelength of emitted light. The ability to easily apply luminescent layers having a wide range of possible light emission characteristics makes it possible to "tailor" the coated particle to produce a very wide variety of light emissions. Specific, characteristic combinations of emitted light wavelengths can be produced, which can act, for example, as "fingerprints" which enable identification of the source of the emitted light.

The thickness of the applied films typically will be in the range of about 1 to about 500 nm. An advantage of the invention is that the ALD process is capable of forming highly uniform films at very small thicknesses. Thus, a preferred film thickness is from about 5 to about 100 nm. It has been found that films of such thicknesses can perform very well as passivating films. A more preferred film thickness is from about 10-100 nm, and an especially preferred film thickness is from 15-75 nm. Film thickness is controlled via the number of reaction cycles that are performed.

The particulate is preferably non-agglomerated after the inorganic material is deposited. By "non-agglomerated", it means that the particles do not form significant amounts of agglomerates during the process of coating the substrate particles. Particles are considered to be non-agglomerated if (a) the average particle size does not increase more than about 5%, preferably not more than about 2%, more preferably not more than about 1% (apart from particle size increases attributable to the coating itself) as a result of depositing the coating, or (b) if no more than 2 weight %, preferably no more than 1 weight % of the particles become agglomerated during the process of depositing the inorganic material.

In preferred embodiments, the deposits of inorganic material form a conformal coating. By "conformal" it is meant that the thickness of the coating is relatively uniform across the surface of the particle (so that, for example, the thickest regions of the coating are no greater than 3× (preferably no greater than 2×, especially no greater than 1.5×) the thickness of the thinnest regions), so that the surface shape of the coated substrate closely resembles that of the underlying substrate surface. Conformality is determined by methods such as transmission electron spectroscopy (TEM) that have resolution of 10 nm or below. Lower resolution techniques cannot distinguish conformal from non-conformal coatings at this scale. The desired substrate surface is preferably coated substantially without pinholes or defects.

A wide range of reaction schemes can be used to provide desirable films on the particle surfaces. Some exemplary classes of reaction schemes are described below.

Oxide and nitride films can be prepared on particles having surface hydroxyl or amine (M—N—H) groups using a binary (AB) reaction sequence as follows. The asterisk (*) indicates the atom that resides at the surface of the particle or coating, and Z represents oxygen or nitrogen. $M^1$ is an atom of a metal (or semimetal such as silicon), particularly one having a valence of 3 or 4, and X is a displaceable nucleophilic group. The reactions shown below are not balanced, and are only intended to show the reactions at the surface of the particles.

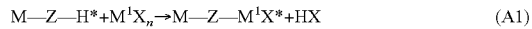

$$M-Z-H^* + M^1X_n \rightarrow M-Z-M^1X^* + HX \quad (A1)$$

$$M-Z-M^1X^* + H_2O \rightarrow M-Z-M^1OH^* + HX \quad (B1)$$

In reaction A1, reagent $M^1X_n$ reacts with one or more $M^*$—Z—H groups on the surface of the particle to create a new surface group having the form —$M^1$—X. $M^1$ is bonded to the particle through one or more Z atoms. The —$M^1$—X group represents a site that can react with water in reaction B1 to regenerate one or more hydroxyl groups. The hydroxyl groups formed in reaction B1 can serve as functional groups through which reactions A1 and B1 can be repeated, each time adding a new layer of $M^1$ atoms. Note that in some cases (such as, e.g., when $M^1$ is silicon, zirconium, titanium, yttrium or aluminum) hydroxyl groups can be eliminated as water, forming $M^1$—O—$M^1$ bonds within or between layers. This condensation reaction can be promoted if desired by, for example, annealing at elevated temperatures and/or reduced pressures.

Binary reactions of the general type described by equations A1 and B1, where $M^1$ is silicon, are described more fully in J. W. Klaus et al, "Atomic Layer Controlled Growth of $SiO_2$ Films Using Binary Reaction Sequence Chemistry", *Appl. Phys. Lett.* 70, 1092 (1997) and O. Sheh et al., "Atomic Layer Growth of $SiO_2$ on Si(100) and $H_2O$ using a Binary Reaction Sequence", *Surface Science* 334, 135 (1995), both incorporated herein by reference. Binary reactions of the general type described by equations A1 and B1, where $M^1$ is aluminum, are described in A. C. Dillon et al, "Surface Chemistry of $Al_2O_3$ Deposition using $Al(CH_3)_3$ and $H_2O$ in a Binary reaction Sequence", *Surface Science* 322, 230 (1995) and A. W. Ott et al., "$Al_2O_3$ Thin Film Growth on Si(100) Using Binary Reaction Sequence Chemistry", *Thin Solid Films* 292, 135 (1997). Both of these references are incorporated herein by reference. General conditions for these reactions as described therein can be adapted to construct $SiO_2$ and $Al_2O_3$ coatings on particulate materials in accordance with this invention. A specific reaction sequence of the A1/B1 type that produces alumina is:

$$Al—(CH_3)^* + H_2O \rightarrow Al—OH^* + CH_4 \tag{A1A}$$

$$Al—OH^* + Al(CH_3)_3 \rightarrow Al—O—Al(CH_3)_2^* + CH_4 \tag{B1A}$$

This particular sequence of reactions is particularly preferred to deposit alumina, as the reactions proceed well even at temperature below 350°K. This particular reaction sequence tends to deposit $Al_2O_3$ ALD at a rate of ~1.2 Å per AB. Triethyl aluminum (TEA) can be used in place of trimethyl aluminum.

Analogous reaction sequences can be performed to produce nitride and sulfide deposits. An illustrative reaction sequence for producing a nitride coating is:

$$M—Z—H^* + M^1X_n \rightarrow M—Z—M^1X^* + HX \tag{A2}$$

$$M—Z—M^1X^* + NH_3 \rightarrow M—Z—M^1NH^* + HX \tag{B2}$$

Ammonia can be eliminated to form $M^1$—N—$M^1$ bonds within or between layers. This reaction can be promoted if desired by, for example, annealing at elevated temperatures and/or reduced pressures.

An illustrative reaction sequence for producing sulfide deposits is:

$$M—Z—H^* + M^1X_n \rightarrow M—Z—M^1X^* + HX \tag{A3}$$

$$M—Z—M^1X^* + H_2S \rightarrow M—Z—M^1SH^* + HX \tag{B3}$$

Hydrogen sulfide can be eliminated to form $M^1$—S—$M^1$ bonds within or between layers. As before, this reaction can be promoted by annealing at elevated temperatures and/or reduced pressures. This reaction scheme is particularly useful for forming a luminescent layer, as sulfides such as Zn, Sr and Ga sulfide are good host materials. To form a luminescent layer, a portion of the M atoms will be metals that form luminescent centers as described above.

In the foregoing reaction sequences, preferred metals $M^1$ include silicon, aluminum, yttrium, titanium, zinc, magnesium and zirconium. Suitable replaceable nucleophilic groups will vary somewhat with $M^1$, but include, for example, fluoride, chloride, bromide, alkoxy, alkyl, acetylacetonate, and the like. Specific compounds having the structure $M^1X_n$ that are of particular interest are silicon tetrachloride, tungsten hexafluoride, tetramethylorthosilicate ($Si(OCH_3)_4$), tetraethyl-orthosilicate ($Si(OC_2H_5)_4$), trimethyl aluminum ($Al(CH_3)_3$), triethyl aluminum ($Al(C_2H_5)_3$), other trialkyl aluminum compounds, yttrium acetylacetonate, cobalt acetylacetonate, and the like.

In addition, catalyzed binary reaction techniques such as described in U.S. Pat. No. 6,818,250, incorporated by reference, are suitable for depositing inorganic materials, in particular oxide coatings. Reactions of this type can be represented as follows:

$$M—F_1 + C_1 \rightarrow M—F_1 \ldots C_1 \tag{A4a}$$

$$M—F_1 \ldots C_1 + F_2—M^1—F_2 \rightarrow M—M^1—F_2 + F_1—F_2 + C_1 \tag{A4b}$$

$$M—M^1—F_2 + C_2 \rightarrow M—M^1—F_2 \ldots C_2 \tag{B4a}$$

$$M—M^1—F_2 \ldots C_2 + F_1—M—F_1 \rightarrow M—M^1—F_1 + F_1—F_2 + C_2 \tag{B4b}$$

$C_1$ and $C_2$ represent catalysts for the A4b and B4b reactions, and may be the same or different. $F_1$ and $F_2$ represent functional groups, and M and $M^1$ are as defined before, and can be the same or different. Reactions A4a and A4b together constitute the first part of a binary reaction sequence, and reactions B4a and B4b together constitute the second half of the binary reaction sequence. An example of such a catalyzed binary reaction sequence is:

$$Si—OH^* \text{ (particle)} + C_5H_5N \rightarrow Si—OH \ldots C_5H_5N^*$$

$$Si—OH \ldots C_5H_5N^* + SiCl_4 \rightarrow Si—O—SiCl_3^* + C_5H_5N + HCl$$

$$Si—O—SiCl_3^* + C_5H_5N \rightarrow Si—O—SiCl_3 \ldots C_5H_5N^*$$

$$Si—O—SiCl_3 \ldots C_5H_5N^* + H_2O \rightarrow Si—O—SiOH^* + C_5H_5N + HCl$$

where the asterisks (*) again denote atoms at the surface of the particle. This general method is applicable to depositing various other materials, including zirconia or titania.

Suitable binary reaction schemes for depositing metals include those described in the U.S. Pat. No. 6,958,174, which is incorporated herein by reference. A specific reaction scheme described therein involves sequential reactions of a substrate surface with a metal halide followed by a metal halide reducing agent. The metal of the metal halide is preferably one that forms a luminescent center in a luminescent layer that is deposited on a particle of a host material.

Another binary reaction scheme suitable for depositing a metal ($M^2$) on a particle having surface hydroxyl or amine groups can be represented as:

$$M^* —Z—H + M^2X_n \rightarrow M—Z—M^{2*}X + HX \quad \text{(precursor reaction)}$$

$$M—Z—M^2X^* + H_2 \rightarrow M—Z—M^2—H^* + HX \tag{B6}$$

$$M—Z—M^2—H^* + M^2(acac) \rightarrow M—Z—M^2—M^{2*} \text{(acac)} \tag{A6}$$

"Acac" refers to acetylacetonate ion, and X, Z and M are as defined before. Also as before, the asterisk (*) refers to an atom residing at the surface of the particle. By heating to a sufficient temperature, hydrogen bonded to the surface as $M^2$—H will thermally desorb from the surface as $H_2$, thereby generating a final surface composed of $M^2$ atoms.

In another embodiment, the coated particles are treated with a hydrophobic compound in order to increase their hydrophobic nature and provide further protection against hydrolysis or reaction with water-soluble materials. The hydrophobic compound is conveniently applied as a final step in the ALD process. A suitable hydrophobic compound includes one or more alkyl or, preferably, fluoroalkyl groups and at least one functional group that can react with a surface species on the surface of the particle and form a bond to the particle surface. Aminosilanes containing alkyl and especially fluoroalkyl groups are examples of such hydrophobic compounds. A specific example of such a compound is tridecafluoro-1,1,2,2-tetrahydrooctylmethyl-bis(dimethylamino) silane (FOMB(DMA)S, $C_8F_{13}H_4(CH_3)Si(N(CH_3)_2)_2$).

The following examples are provided to illustrate the invention, but are not intended to limit its scope. All parts and percentages are by weight unless otherwise indicated.

EXAMPLE 1

Zinc sulfide-based phosphor particles having a particle size of approximately 26 +/−1 micron are placed into a fluidized bed reactor. The fluidized bed column is tubular and constructed of stainless steel. It is heated using an external furnace that surrounds the reactor. The column has an inside diameter of 6 cm and a height of 60 cm. It is equipped with a distributor constructed of 10 micron average pore size porous stainless steel. The upper head of the fluidized bed reactor contains four internal 10 micron pore size porous metal filters that prevent phosphor particles from being entrained out of the fluidized bed. Protruding from the center of the fluidized bed upper head is a long stirring device that extends to the distributor plate where it sweeps across the distributor plate surface and up the outside wall. It is connected to an external drive via a magnetic coupling. Four internal filters are on a manifold that connects to a pipe leading to a vacuum pump (Alcatel model 2063) that provides system vacuum. A plenum section below the gas distributor is connected to a mass flow controller, which controls the fluidizing gas flow. Separate injection loops are provided for the introduction of the reactants, each with a needle valve controlling each loop's final conductance. Reactant vapor pressure is used as the driving force for flow. A purge setup is achieved by connecting the system to both a mass flow controller that provides a nitrogen source and a separate vacuum pump, one for each loop (Alcatel model 2010). Valves that control the system flows are all pneumatically operated and remotely controlled via a LabVIEW™ program running on a personal computer. The fluidized bed reactor is mounted to a plate which is vibrated using two Martin Engineering vibratory motors. The mechanical vibration is useful for improving the fluidizability of ultrafine particles.

The particles require a minimum fluidization velocity at 1.4 Torr pressure of 8 cm/s, or 25 sccm $N_2$@STP. Dry nitrogen is supplied to the reactor at that rate from a liquid nitrogen source dewar. Trimethylaluminum and water vapor are separately admitted into the system via two separate injection loops. The loops are constructed to ensure that both loops have the same conductance, with a needle valve controlling each loop's final conductance. Reactant vapor pressure is used as the driving force for flow.

100 grams of the phosphor particles are placed in the stainless steel tubular fluidized bed reactor. This height of the bed is approximately 3 cm above the distributor. The bed is vibrated and system pressure is brought down to an operating pressure of approximately 2 Torr. Fluidizing/purging gas flow is started at 25 sccm. The reactor is then heated to a temperature of 350K. Trimethyl aluminum is admitted into the reactor for 20 seconds, followed by a 50 second flow of the purge gas. Water vapor is then admitted into the reactor for 20 seconds, followed by another 50 second flow of the fluidization gas. This sequence is repeated 20 times. A film of approximately 1 angstrom thickness is deposited each cycle. Film thickness at the end of the 20 cycles is about 2.5 nanometers.

XPS analysis of the surface of these particles indicates that the surface has become coated with alumina, as evidenced by the appearance of Al 2 p peaks in the spectrum at binding energy values of approximately 72-77 eV. A particle size distribution analysis of the alumina coated particles indicates that the average particle size is 27.0+/−1.0 micron, thus indicating that essentially no agglomeration of phosphor particles has occurred.

The coated ZnS phosphor particles are placed in a silver nitrate solution at room temperature. This is a simple test of the integrity of the applied coating, as silver nitrate that contacts the zinc sulfide will form silver sulfide, which causes the particles to turn black. The particles turn black in less than 1 hour.

A lighting test lamp device is fabricated using the coated particles. The lamp shines more brightly than a similar lamp coated with ZnS based phosphor particles coated via a CVD process. The improved brightness is attributed to (1) the films being thinner (approximately 50 nanometers, instead of 500 to 1000 nanometers as is typical of a CVD process) and (2) the film being conformal and non-granular.

EXAMPLE 2

The method of Example 1 is repeated with the exception that the number of reaction cycles is increased to 175. An alumina film thickness of approximately 20 nanometers thickness is produced. Some of the coated particles are placed in a silver nitrate solution. The particles turn black after 2 days, thus indicating that the silver nitrate penetrates the 20 nanometer alumina film much more slowly than it does the 2.5 nanometer film of Example 1. A lighting test lamp device fabricated of some of the freshly coated particles shines more brightly than a like lamp made using conventionally coated ZnS based phosphor materials.

EXAMPLE 3

The method of Example 1 is repeated with the exception that the number of reaction cycles is increased to 550. An alumina film thickness of approximately 60 nanometers thickness is produced on the surface of the phosphor particles. Some of the coated particles are placed in a silver nitrate solution as before, but show no evidence of reaction even after one month. As before, a lamp produced from these particles shines more brightly than one made using conventionally coated phosphor particles.

EXAMPLE 4

A rotary fluidized bed reactor is used to coat zinc sulfide-based phosphor particles in this example. The rotary fluidized bed reactor is similar to that used in Example 1, except that the particles are contained in a porous metal cylinder located in a vacuum system. This porous metal has an average pore size of 20 microns. The porous metal cylinder has an inside diameter of 7.5 cm and a length of 20 cm. The particles are rotated in the cylinder at 90 rpm using a magnetically coupled rotary motion feedthrough.

200 grams of 25 micron average diameter zinc sulfide based phosphor particles are placed in the stainless steel porous metal cylinder. This fills the porous metal cylinder to approximately 15% of the total volume. The system is pumped to a base pressure of 30 mTorr. The reactor is then heated to 450 K. This deposition temperature allows for anatase phase titania to be deposited, though other deposition temperatures can be used if desired to produce rutile or amorphous titania films. Titanium tetrachloride is introduced to the reactor to a pressure of 8 Torr and allowed to react statically at the particle surface for 60 seconds. The system is then evacuated to base pressure and 30 Torr of nitrogen fills the chamber. This is held statically for 5 seconds. The reactor is then evacuated to base pressure again. Next, water vapor is introduced to the reactor to a pressure of 8 Torr, allowed to react statically for 60 seconds and evacuated to base pressure. Nitrogen is again introduced and evacuated for another purge step. This sequence is repeated 125 times. An average titania ($TiO_2$) growth rate of approximately 0.4 Angstroms per cycle is achieved, resulting in a final film thickness of approximately 5 nanometers.

XPS analysis of the surface of these particles indicates that the surface is coated with titania ($TiO_2$), as evidenced by the appearance of a Ti 2 $p^{3/2}$ peak in the spectrum at binding energy values of approximately 458 eV. The powder has a surface area of 0.6 $m^2 g^{-1}$. A particle size distribution analysis of the titania coated particles indicates an average particle size of 25 microns, thus indicating that no measurable agglomeration of phosphor particles occurs during the coating process.

The coated phosphor particles are placed in a silver nitrate solution as described before. The particles turn black in during the fifth day of testing. A lighting test lamp device is fabricated as described in Example 1. A lamp fabricated from the coated particles shines more brightly than a control lamp containing a conventionally-coated phosphor.

What claimed is:

1. A method comprising forming a layer of an inorganic material on the surface of a phosphor particle via an atomic layer deposition process, wherein the product coated phosphor particles are non-agglomerated and the passivating film is conformal, lacks pinholes or defects, and is transparent or nearly transparent to photons emitted by the phosphor particle.

2. The method of claim 1, wherein the atomic layer deposition process is conducted at a temperature of no greater than 475° C.

3. The method of claim 2, wherein the inorganic material has a thickness of about 5 to about 100 nm.

4. The method of claim 3, wherein the inorganic material is a passivating layer.

5. The method of claim 3, wherein the inorganic material is alumina or titania.

6. The method of claim 3, wherein the phosphor includes a host material that contains luminescent centers.

7. The method of claim 6, wherein the host material is at least one of ZnS, CaS, (ZnCd)S, CaS, (CaSrGa)S, $CaGa_2S_4$, $ZnGa_2O_4$, $Zn_2SiO_4$, $Y_2O_2S$, $Y_2SiO_5$, SrS, $SrGa_2S_4$, ZnO and $Y_2O_3$.

8. The method of claim 3, further comprising depositing a layer of a hydrophobic material atop the layer of the inorganic material.

9. Coated phosphor particles having a conformal passivating film of 5-100 nm thickness lacking pinholes or defects which has been deposited by an ALD process, wherein the phosphor particles are non-agglomerated and the passivating film is transparent or nearly transparent to photons emitted by the phosphor particle.

* * * * *